(12) United States Patent
Lee et al.

(10) Patent No.: US 8,853,032 B2
(45) Date of Patent: Oct. 7, 2014

(54) SEMICONDUCTOR DEVICE AND METHOD FOR MANUFACTURING THE SAME

(71) Applicant: SK Hynix Inc., Icheon (KR)

(72) Inventors: Sang Kee Lee, Icheon (KR); Jong Hwan Kim, Yongin (KR)

(73) Assignee: SK Hynix Inc., Icheon (KR)

( * ) Notice: Subject to any disclaimer, the term of this patent is extended or adjusted under 35 U.S.C. 154(b) by 22 days.

(21) Appl. No.: 13/717,507

(22) Filed: Dec. 17, 2012

(65) Prior Publication Data

US 2013/0248989 A1    Sep. 26, 2013

(30) Foreign Application Priority Data

Mar. 22, 2012 (KR) .................. 10-2012-0029321

(51) Int. Cl.
| | | |
|---|---|---|
| *H01L 21/336* | (2006.01) | |
| *H01L 21/20* | (2006.01) | |
| *H01L 21/31* | (2006.01) | |
| *H01L 21/469* | (2006.01) | |
| *H01L 29/66* | (2006.01) | |
| *H01L 29/423* | (2006.01) | |
| *H01L 29/08* | (2006.01) | |
| *H01L 29/78* | (2006.01) | |
| *H01L 21/225* | (2006.01) | |

(52) U.S. Cl.
CPC ....... *H01L 29/66666* (2013.01); *H01L 21/2257* (2013.01); *H01L 29/66621* (2013.01); *H01L 29/4236* (2013.01); *H01L 29/0847* (2013.01); *H01L 29/78* (2013.01); *H01L 29/7827* (2013.01)
USPC ..... 438/270; 438/381; 438/785; 257/E29.262

(58) Field of Classification Search
CPC .................. H01L 29/6666; H01L 29/7827
USPC .................. 438/270, 381, 785; 257/E29.262
See application file for complete search history.

(56) References Cited

U.S. PATENT DOCUMENTS

| 8,445,369 B2 * | 5/2013 | Kim ............................ 438/514 |
|---|---|---|
| 2011/0018057 A1 * | 1/2011 | Kim ............................ 257/330 |

* cited by examiner

*Primary Examiner* — David S Blum

(57) ABSTRACT

A semiconductor device and a method for manufacturing the same are disclosed, which include a gate electrode material in a recess or a buried gate cell structure, a polysilicon material doped with impurities over a sidewall of a recess located over the gate electrode material, and a junction formed by an annealing or a rapid thermal annealing (RTA) process, thereby establishing a degree overlap between a gate electrode material of a buried gate and a junction.

8 Claims, 6 Drawing Sheets

SEMICONDUCTOR DEVICE AND METHOD FOR MANUFACTURING THE SAME

CROSS-REFERENCE TO RELATED APPLICATION

The priority of Korean patent application No. 10-2012-0029321 filed on 22 Mar. 2012, the disclosure of which is hereby incorporated in its entirety by reference, is claimed.

BACKGROUND OF THE INVENTION

Embodiments of the present invention relate to a semiconductor device and a method for manufacturing the same, including a gate electrode material in a recess or a buried gate cell structure, a polysilicon material doped with impurities over a sidewall of a recess located over the gate electrode material, and a junction formed using an annealing or a rapid thermal annealing (RTA) process, thereby establishing an overlap thickness between a gate electrode material of a buried gate and a junction.

In the case where a general transistor is formed on a semiconductor substrate, a method of forming a gate over the semiconductor substrate and doping impurities into both sides of the gate so as to form a source and a drain has been used. As the data storage capacity of a semiconductor memory device increases, a unit cell size is gradually decreased. That is, a design rule for a capacitor and a transistor in the unit cell has been reduced. Thus, while a channel length of a cell transistor is gradually decreased, a short channel effect, a Drain Induced Barrier Lower (DIBL) phenomenon, etc. occur in a conventional transistor, and thus operational reliability is decreased. In order to maintain a threshold voltage at a desirable level under an influence from a short channel effect and a DIBL phenomenon, a concentration of impurities in a channel may be increased.

However, if a high concentration of impurities is applied to a channel region of a device which is subject to a design rule of 100 nm or less, an electric field of a Storage Node (SN) junction is increased, thereby lowering refresh characteristics of a semiconductor memory device. In order to solve this problem, a cell transistor having a three-dimensional channel structure in which a channel extends in a vertical direction is used such that a desirable channel length of a cell transistor is maintained even when a design rule is decreased. That is, even when a channel width in a horizontal direction is short, since a channel length in a vertical direction is secured, an impurity doping concentration may be reduced and thus refresh characteristics are prevented from being lowered.

In addition, as the degree of integration in a semiconductor device is increased, a distance between a word line coupled to a cell transistor and a bit line coupled to the cell transistor is gradually reduced. As a result, a parasitic capacitance is increased and an operation margin of a sense amplifier (sense-amp) that amplifies data transmitted via the bit line is deteriorated, reducing reliability of the semiconductor device. In order to solve the above-mentioned shortcomings while simultaneously reducing a parasitic capacitance between a bit line and a word line, a buried word line structure in which a word line is formed only in a recess instead of over an upper part of a semiconductor substrate has been proposed. The buried word line structure forms a conductive material in a recess formed in a semiconductor substrate, and covers an upper part of the conductive material with an insulation film such that the word line is buried in the semiconductor substrate. As a result, the buried word line structure can be electrically isolated from a bit line formed over a semiconductor substrate.

However, a buried word line (buried gate) structure has some disadvantages. First, a leakage current caused by a Gate Induced Drain Leakage (GIDL) of a semiconductor device is increased between a conductive material (gate electrode) and an N-type junction or between a conductive material (gate electrode) and a storage node contact. Second, refresh characteristics of the semiconductor device are deteriorated due to GIDL. In order to substantially prevent a leakage current caused by GIDL from being increased, large amounts of conductive material (gate electrode) of the buried word line (buried gate) need to be etched so that an overlap region between the storage node contact and the conductive material (gate electrode) can be minimized. However, if large amounts of the conductive material (gate electrode) of such a buried word line (buried gate) are etched, a resistance of the buried word line (buried gate) increases even though a leakage current caused by GIDL characteristics can be prevented. Thus, an operation speed of the semiconductor device slows down.

As described above, it is difficult to consistently form a region overlapping the buried word line (buried gate) and a junction. The junction couples the buried word line and a source/drain region. That is, if an overlap region between the buried gate and the junction in the buried gate formation process is small in size, channel resistance is unavoidably increased, resulting in a tWR (Write Recovery time) margin failure. If the overlap region between the buried gate and the junction is large in size, a Gate Induced Drain Leakage (GIDL) is increased, resulting in a pause failure.

BRIEF SUMMARY OF THE INVENTION

Various embodiments of the present invention are directed to providing a semiconductor device and a method for manufacturing the same that substantially solves one or more problems of the related art.

An embodiment of the present invention relates to a semiconductor device and a method for manufacturing the same, which forms a gate electrode material in a recess to form a buried gate cell structure, forms a polysilicon material doped with impurities at a sidewall of a recess located over the gate electrode material, and forms a junction using an annealing or a rapid thermal annealing (RTA) process, thereby adjusting an overlap thickness between a gate electrode material of a buried gate and a junction.

In accordance with one aspect of the present invention, a method for manufacturing a semiconductor device includes forming a recess region by etching a semiconductor substrate; forming a buried gate partially burying the recess region; forming an insulation film along a top surface of the buried gate; forming a polysilicon pattern at a sidewall of the remaining recess region; and forming a junction over the semiconductor substrate contacting the polysilicon pattern.

The forming of the polysilicon pattern may include forming a polysilicon layer over the entire surface including a sidewall of the recess region; and etching the polysilicon layer so that the polysilicon layer remains only at the sidewall of the recess region.

The insulation film may include an oxide film or a nitride film.

The method may further include performing a process for burying a sealing insulation film between the forming of the polysilicon pattern and the forming of the junction.

The polysilicon pattern may be formed of a polysilicon film doped with impurities.

The polysilicon pattern may be annealed or RTA (Rapid Thermal Annealing)-processed so that the resultant polysilicon pattern is doped with impurities.

The method may further include, after forming the buried gate, forming an insulation film over the entire surface including the buried gate and the semiconductor substrate; removing the insulation film from a sidewall of the recess region; forming a polysilicon pattern at a sidewall of the remaining recess region; and forming a junction over the semiconductor substrate contacting the polysilicon pattern.

The forming of the polysilicon pattern may include forming a polysilicon layer over the entire surface including a sidewall of the recess region; and etching the polysilicon layer so that the polysilicon layer remains only at the sidewall of the recess region.

In accordance with another aspect of the present invention, a semiconductor device includes a recess region contained in a semiconductor substrate; a buried gate located at a lower part of the recess region; an insulation film formed along a top surface of the buried gate; a polysilicon pattern formed at a sidewall of the remaining recess region; and a junction contained in the semiconductor substrate contacting the polysilicon pattern.

The insulation film may include an oxide film or a nitride film.

The semiconductor device may further include forming a sealing insulation film over the insulation film formed between the polysilicon patterns.

The semiconductor device may further include a gate insulation film formed between the recess region and the buried gate.

The polysilicon pattern may be formed of a polysilicon film doped with impurities.

It is to be understood that both the foregoing general description and the following detailed description of the present invention are exemplary and explanatory and are intended to provide further explanation of the invention as claimed.

DESCRIPTION OF EMBODIMENTS

Reference will now be made in detail to embodiments of the present invention, examples of which are illustrated in the accompanying drawings. Wherever possible, the same reference numbers will be used throughout the drawings to refer to the same or like parts.

FIGS. 1A to 1E are cross-sectional views illustrating a semiconductor device and a method for forming the same according to an embodiment of the present invention.

Figure 1A:
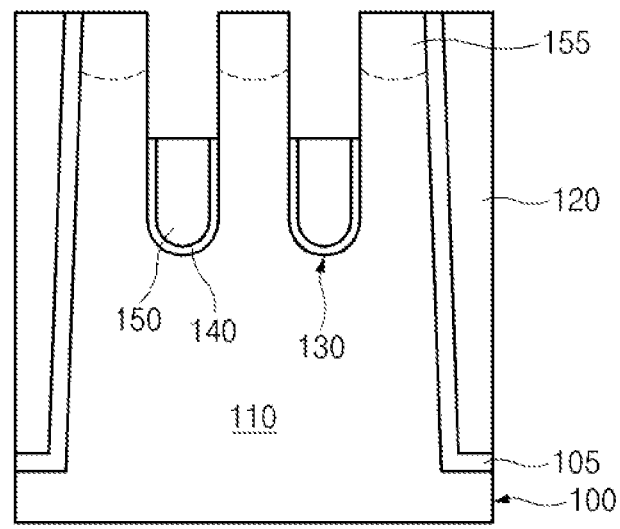
FIGS. 1A to 1E are cross-sectional views illustrating a semiconductor device and a method for forming the same according to an embodiment of the present invention.

Referring to FIG. 1A, a photoresist film is deposited over a semiconductor substrate 100, and an exposure process is carried out using a mask that defines an active region 110. Thereafter, a liner insulation film 105 and a spin on dielectric (SOD) material are buried in a trench formed by etching the exposed semiconductor substrate 100, and a device isolation film 120 defining the active region 110 is formed by performing a planarization etching process such as a chemical mechanical polishing (CMP) method.

After a photoresist film (not shown) is formed over the active region 110 and the device isolation film 120, an exposure process is carried out using a mask defining a buried gate to etch the active region 110, resulting in formation of a recess 130. Preferably, the etching process for forming the recess 130 is an anisotropic etching process.

Thereafter, an oxidation process or an oxide deposition process may be used to form a gate oxidation film 140.

After a gate electrode material 150 is buried in the recess 130 in which the gate oxide film 140 is formed, the gate electrode material 150 and the gate oxide film 140 are etched back, resulting in formation of a buried gate. In this case, the gate electrode material 150 may include aluminum (Al), tungsten (W), tungsten nitride (WN), titanium (Ti), and titanium nitride (TiN), or may include a laminated structure of titanium nitride (TiN) and tungsten (W).

After forming the buried gate, N-type impurities are implanted into the active region 110 such that a source/drain junction 155 can be formed. Also, after forming the device isolation film 120, N-type impurities are implanted into the active region 110 such that a source/drain junction 155 can be formed.

Figure 1B:
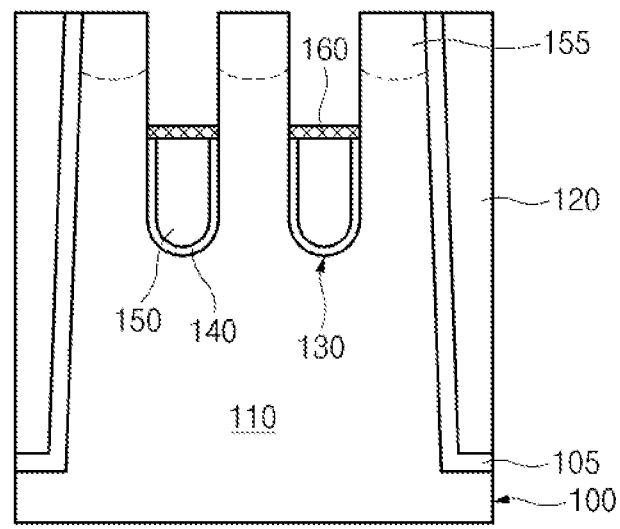

Referring to FIG. 1B, an insulation film 160 is formed over the gate electrode material 150 and the gate oxide film 140. In embodiments, the insulation film 160 may be formed by a selective oxidation process or a nitridation process.

Figure 1C:
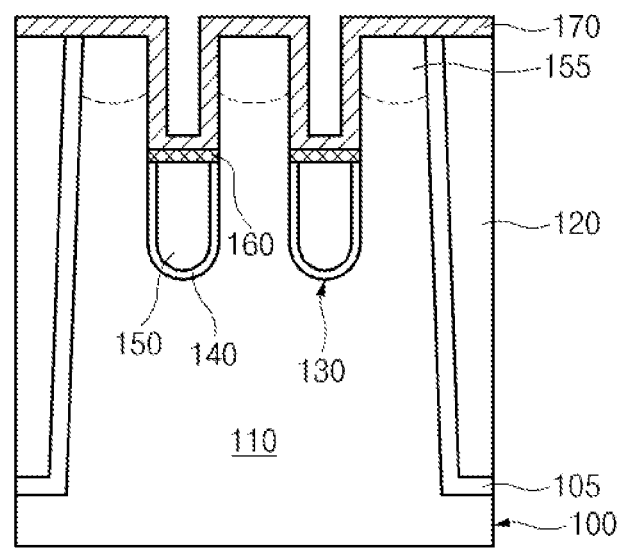

Referring to FIG. 1C, impurity-doped polysilicon 170 is formed over the insulation film 160, the device isolation film 120, and the active region 110.

Figure 1D:
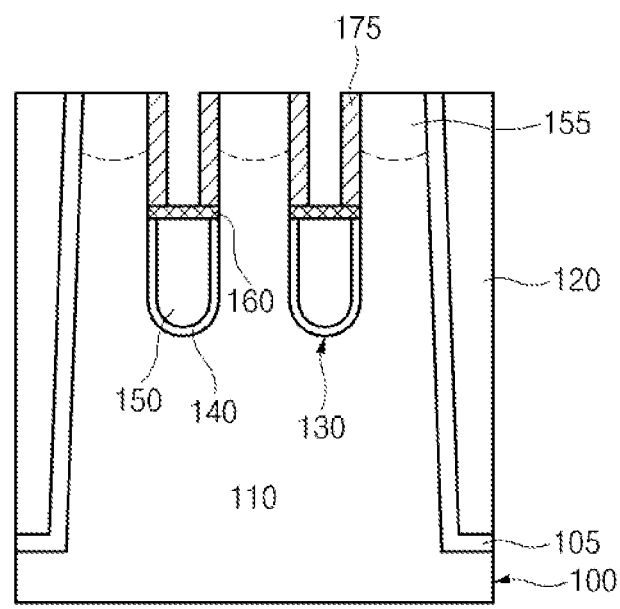

Referring to FIG. 1D, the polysilicon layer 170 doped with impurities is etched so that only portions of polysilicon pattern 175 disposed over sidewalls of the recess 130 remain.

Figure 1E:
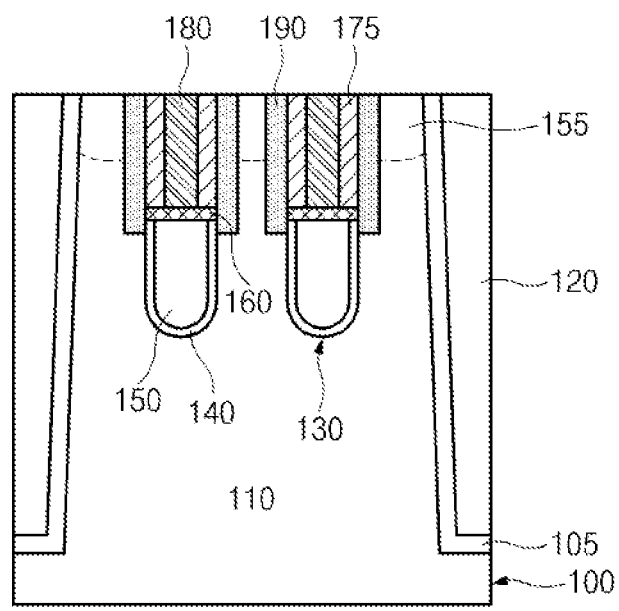

Referring to FIG. 1E, after a sealing insulation film 180 is buried between the polysilicon patterns 175 contained in the recess 130, an annealing process or a rapid thermal annealing (RTA) process is performed to diffuse impurities, so that a junction 190 is formed in the active region 110.

FIGS. 2A to 2F are cross-sectional views illustrating a semiconductor device and a method for forming the same according to another embodiment of the present invention.

Figure 2A:
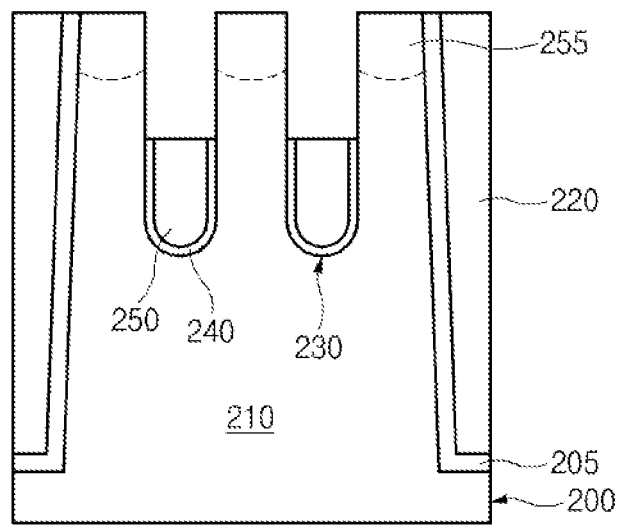
FIGS. 2A to 2F are cross-sectional views illustrating a semiconductor device and a method for forming the same according to another embodiment of the present invention.

Referring to FIG. 2A, a photoresist film is deposited over a semiconductor substrate 200, and an exposure process is carried out using a mask that defines an active region 210. Thereafter, a liner insulation film 105 and a spin on dielectric (SOD) material are buried in a trench formed by etching the exposed semiconductor substrate 200, and a device isolation film 220 defining the active region 210 is formed by performing a planarization etching process such as chemical mechanical polishing (CMP).

After a photoresist film (not shown) is formed over the active region 210 and the device isolation film 220, an exposure process is carried out using a mask defining a buried gate or a recess gate to etch the active region 210, resulting in formation of a recess 230. The etching process for forming the recess 230 may be an anisotropic etching process.

Thereafter, an oxidation film may be deposited over the recess 230, or a gate oxidation film 240 may be formed in the recess 230 using an oxidation process.

A gate electrode material 250 is buried in the recess 230 in which the gate oxide film 240 is formed, and is etched back, so that a buried gate is formed. In an embodiment, the gate electrode material 250 may include aluminum (Al), tungsten (W), tungsten nitride (WN), titanium (Ti), and titanium nitride (TiN), or may include a laminated structure of titanium nitride (TiN) and tungsten (W).

After forming the buried gate, N-type impurities are implanted into the active region 210 such that a source/drain junction 255 can be formed. Also, after forming the device isolation film 220, N-type impurities are implanted into the active region 210 such that a source/drain junction 255 can be formed.

Figure 2B:
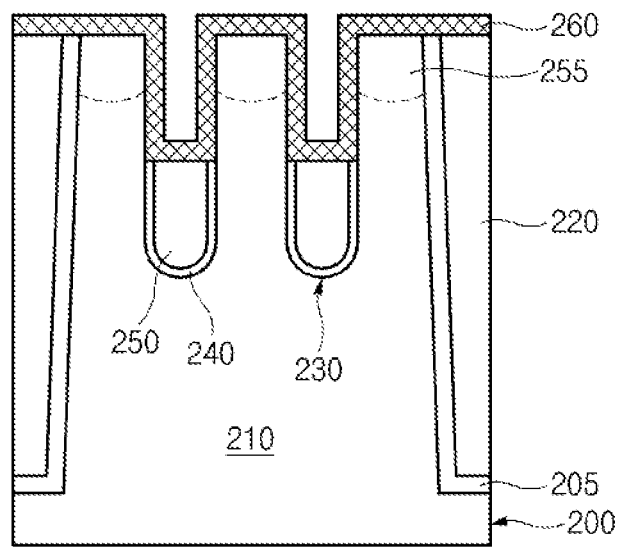

Referring to FIG. 2B, an insulation film 260 is formed over the entire surface including the gate electrode material 250, the device isolation film 220, and the active region 210. The insulation film 260 may include an oxide film or a nitride film.

Figure 2C:
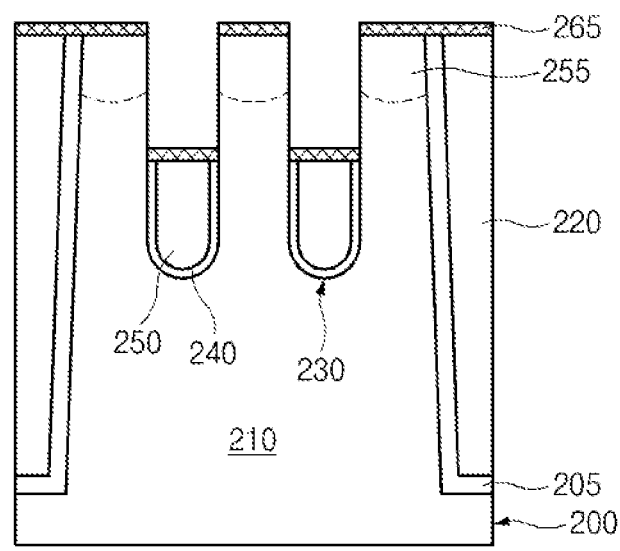

Referring to FIG. 2C, the insulation film 260 formed over sidewalls of the recess 230 is removed, leaving an insulation film pattern 265 over the gate electrode material 250, the device isolation film 220, and the active region 210.

Figure 2D:
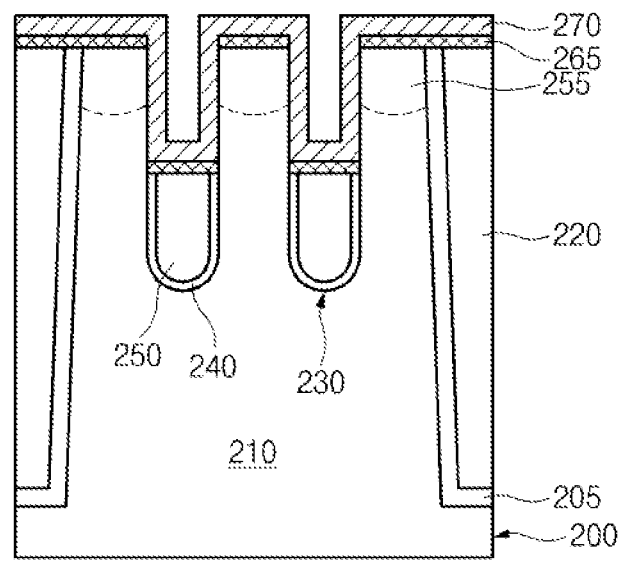

Referring to FIG. 2D, impurity-doped polysilicon 270 is formed over the entire surface including the insulation film pattern 265 and the active region 210.

Figure 2E:
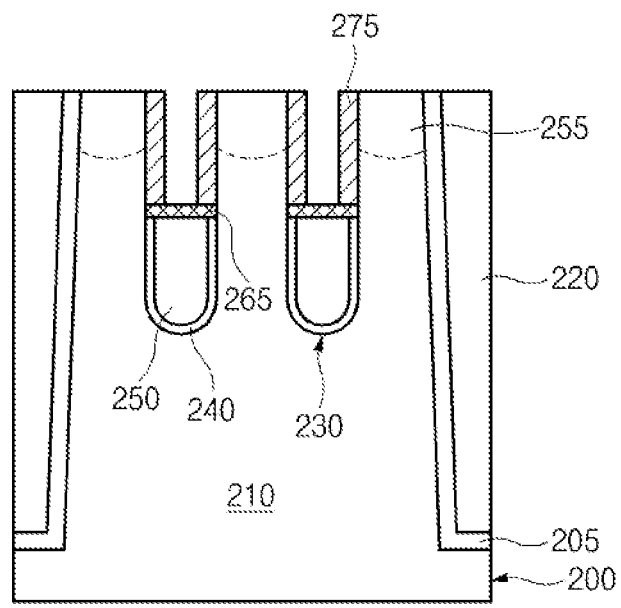

Referring to FIG. 2E, the polysilicon layer 270 doped with impurities is etched so that a polysilicon pattern 275 is formed only over sidewalls of the recess 230.

Figure 2F:
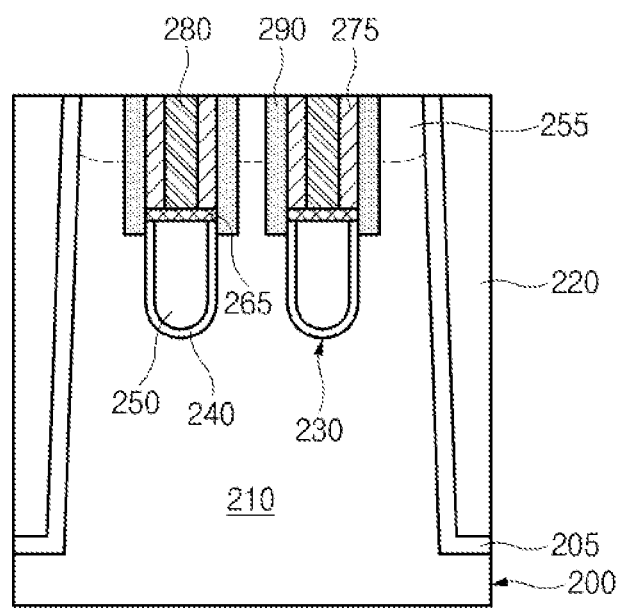

Referring to FIG. 2F, after a sealing insulation film 280 is buried between the polysilicon patterns 275 contained in the recess 230, an annealing process or a rapid thermal annealing (RTA) process is performed to diffuse impurities, so that a junction 290 is formed in the active region 210. The junction 290 is included in the active region 210 contained in a region contacting the polysilicon pattern 275.

As is apparent from the above description, the semiconductor device and methods for manufacturing the same according to embodiments of the present invention include a gate electrode material in a recess or a buried gate cell structure, a polysilicon material doped with impurities at a sidewall of a recess located over the gate electrode material, and a junction formed by using an annealing or a rapid thermal annealing (RTA) process, thereby adjusting a thickness of a junction 190 or 290 coupling a gate electrode of a buried gate and a source/drain region.

The above embodiments of the present invention are illustrative and not limitative. Various alternatives and equivalents are possible. The invention is not limited by the type of deposition, etching polishing, and patterning steps described herein. Nor is the invention limited to any specific type of semiconductor device. For example, the present invention may be implemented in a dynamic random access memory (DRAM) device or non volatile memory device. Other additions, subtractions, or modifications are obvious in view of the present disclosure and are intended to fall within the scope of the appended claims.

What is claimed is:

1. A method for manufacturing a semiconductor device comprising:
    forming a recess region by etching a semiconductor substrate;
    filling a lower portion of the recess region to form a buried gate;
    forming an insulation film along a top surface of the buried gate;
    forming a polysilicon pattern over a sidewall of an upper portion of the recess region; and
    forming a junction in the semiconductor substrate that is in contact with the polysilicon pattern.

2. The method according to claim 1, wherein the forming of the polysilicon pattern includes:
    forming a polysilicon layer over an entire surface including a sidewall of the recess region; and
    etching the polysilicon layer so that portions of the polysilicon layer remain only over sidewalls of the recess region.

3. The method according to claim 1, wherein the insulation film includes an oxide film or a nitride film.

4. The method according to claim 1, the method further comprising forming a sealing insulation film over the polysilicon pattern between the step of forming of the polysilicon pattern and the step of forming of the junction.

5. The method according to claim 1, wherein the polysilicon pattern is formed of a polysilicon film doped with impurities.

6. The method according to claim 1, wherein the step of forming the junction comprises:
    performing an annealing process or a RTA (Rapid Thermal Annealing) process to the polysilicon pattern to form the junction,
    wherein the polysilicon pattern is doped with impurities.

7. The method according to claim 1, wherein the step of forming an insulation film along the top surface of the buried gate comprises:
    forming an insulation film over an entire surface including the buried gate and the semiconductor substrate; and
    removing the insulation film from a sidewall of the recess region, and
    wherein the method further comprising:
    after the step of forming the polysilicon pattern over the sidewall of the upper portion of the recess region, forming a junction in the semiconductor substrate that is in contact with the polysilicon pattern.

8. The method according to claim 7, wherein the step of forming the polysilicon pattern includes:
    forming a polysilicon layer over an entire surface including sidewalls of the recess region; and
    etching the polysilicon layer so that portions of the polysilicon layer remain only over the sidewalls of the recess region.

* * * * *